United States Patent
Kaneda

(10) Patent No.: US 10,469,067 B2
(45) Date of Patent: Nov. 5, 2019

(54) GATE DRIVING CIRCUIT AND SWITCHING POWER SUPPLY DEVICE

(71) Applicant: FUJI ELECTRIC CO., LTD., Kanagawa (JP)

(72) Inventor: Hirotoshi Kaneda, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 3 days.

(21) Appl. No.: 15/792,914

(22) Filed: Oct. 25, 2017

(65) Prior Publication Data
US 2018/0131364 A1    May 10, 2018

(30) Foreign Application Priority Data
Nov. 9, 2016  (JP) ................. 2016-219090

(51) Int. Cl.
| | | |
|---|---|---|
| H03K 17/0812 | (2006.01) | |
| H03K 17/0814 | (2006.01) | |
| H03K 17/30 | (2006.01) | |
| H03K 17/16 | (2006.01) | |

(52) U.S. Cl.
CPC . *H03K 17/08122* (2013.01); *H03K 17/08142* (2013.01); *H03K 17/166* (2013.01); *H03K 17/302* (2013.01)

(58) Field of Classification Search
USPC ........................................ 327/427
See application file for complete search history.

(56) References Cited

U.S. PATENT DOCUMENTS

| | | | | |
|---|---|---|---|---|
| 5,309,078 A | * | 5/1994 | Cameron ............... | H02P 27/08 318/811 |
| 5,650,694 A | * | 7/1997 | Jayaraman ......... | H05B 41/2828 307/157 |
| 6,337,974 B1 | * | 1/2002 | Inamori ................ | H03G 1/007 327/308 |
| 7,508,267 B1 | * | 3/2009 | Yu .......................... | H03F 3/195 330/286 |
| 7,760,003 B2 | * | 7/2010 | Wu ...................... | H03H 11/245 327/306 |
| 8,571,511 B2 | * | 10/2013 | Goldfarb .............. | H03D 7/1441 455/290 |

(Continued)

FOREIGN PATENT DOCUMENTS

| | | |
|---|---|---|
| EP | 3 089 346 A1 | 11/2016 |
| JP | 11-234104 A | 8/1999 |

(Continued)

OTHER PUBLICATIONS

Japanese Office Action, dated Jun. 5, 2018, issued in corresponding Japanese Patent Application No. 2016-219090. Including English translation. Total 12 pages.

(Continued)

*Primary Examiner* — Adam D Houston
(74) *Attorney, Agent, or Firm* — Ostrolenk Faber LLP

(57) ABSTRACT

A gate driving circuit is connected to a main switching element. The gate driving circuit includes a gate resistor. The gate resistor includes a voltage controlled resistor of which a resistance value is able to be continuously changed. A switching power supply device includes a gate driving circuit, a main switching element, and a freewheeling diode connected in reverse parallel to the main switching element.

6 Claims, 8 Drawing Sheets

(56) References Cited

U.S. PATENT DOCUMENTS

| | | | | |
|---|---|---|---|---|
| 8,594,593 | B2 * | 11/2013 | Hoshino | H03D 7/1458 |
| | | | | 455/118 |
| 9,497,807 | B2 * | 11/2016 | Pitigoi-Aron | H05B 33/0815 |
| 9,755,599 | B2 * | 9/2017 | Yuan | H03G 3/3036 |
| 9,806,915 | B1 * | 10/2017 | Elzeftawi | H04L 25/03885 |
| 10,075,141 | B1 * | 9/2018 | Nagulapalli | H03F 3/193 |
| 2004/0027202 | A1 * | 2/2004 | Orr | H03F 1/18 |
| | | | | 330/286 |
| 2004/0213026 | A1 * | 10/2004 | Park | H02M 1/088 |
| | | | | 363/132 |
| 2008/0290911 | A1 * | 11/2008 | Williams | H03K 17/18 |
| | | | | 327/109 |
| 2009/0212839 | A1 * | 8/2009 | Chung | H04B 1/30 |
| | | | | 327/307 |
| 2010/0194309 | A1 * | 8/2010 | Ueno | H05B 41/382 |
| | | | | 315/307 |
| 2011/0015788 | A1 * | 1/2011 | Celik | H02P 6/14 |
| | | | | 700/275 |
| 2011/0254488 | A1 * | 10/2011 | Clothier | H02P 25/0925 |
| | | | | 318/400.14 |
| 2013/0314834 | A1 * | 11/2013 | Tamaki | H02H 3/08 |
| | | | | 361/93.1 |
| 2014/0167821 | A1 * | 6/2014 | Yang | H03H 11/245 |
| | | | | 327/108 |
| 2014/0312813 | A1 * | 10/2014 | Murchie | A47L 9/2842 |
| | | | | 318/400.03 |
| 2015/0236686 | A1 * | 8/2015 | Senda | H03K 17/0828 |
| | | | | 327/381 |
| 2017/0149398 | A1 * | 5/2017 | Agarwal | H03G 1/0094 |
| 2017/0310249 | A1 * | 10/2017 | Zheng | H02P 1/46 |

FOREIGN PATENT DOCUMENTS

| | | |
|---|---|---|
| JP | 11-069779 A | 9/1999 |
| JP | 3568848 B2 | 9/2004 |
| JP | 3666843 B2 | 6/2005 |
| JP | 3941309 B2 | 7/2007 |
| JP | 2013-110878 A | 6/2013 |
| JP | 2014-230307 A | 12/2014 |
| JP | 2016-059108 A | 4/2016 |
| JP | 2016-073052 A | 5/2016 |
| WO | WO 2015/097836 A1 | 7/2015 |

OTHER PUBLICATIONS

Japanese Office Action dated Mar. 14 2017 in corresponding Japanese Patent Application No. 2016-219090, along with an English translation thereof.

Japanese Office Action dated Aug. 8, 2017 in corresponding Japanese Patent Application No. 2016-219090, along with an English translation thereof.

* cited by examiner

GATE DRIVING CIRCUIT AND SWITCHING POWER SUPPLY DEVICE

BACKGROUND OF THE INVENTION

Field of the Invention

Embodiments of the present disclosure relate to a gate driving circuit and a switching power supply device.

Description of Related Art

In the related art, a gate driving circuit connected to a switching element and including a gate resistor is known (see, for example, Patent Document 1). The gate driving circuit described in Patent Document 1 is provided with a gate resistor variable circuit.

[Patent Document 1] Japanese Unexamined Patent Application, First Publication No. 2016-059108

Incidentally, in the gate driving circuit described in Patent Document 1, the gate resistor variable circuit includes a plurality of FETs. Further, in the gate driving circuit described in Patent Document 1, a plurality of gate resistor variable circuits having a complicated configuration are provided, and a plurality of gate resistor control circuits corresponding to the plurality of gate resistor variable circuits are provided. Therefore, in the gate driving circuit described in Patent Document 1, the number of components is large, and a configuration of the entire circuit is complicated.

SUMMARY OF THE INVENTION

An object of the present disclosure is to provide a gate driving circuit and a switching power supply device capable of suppressing a surge voltage and a switching loss with a simple configuration.

An embodiment of the present disclosure provides a gate driving circuit that is connected to a main switching element and includes a gate resistor, wherein the gate resistor includes a voltage controlled resistor of which a resistance value is able to be continuously changed.

Further, the gate driving circuit of an embodiment of the present disclosure may further include a control circuit configured to set a voltage value that is input to the voltage controlled resistor on the basis of an output current value of the main switching element.

Further, the gate driving circuit of the embodiment of the present disclosure may further include a control circuit configured to set a voltage value that is input to the voltage controlled resistor on the basis of a signal that is output from a signal source that drives the main switching element.

Further, in the gate driving circuit according to the embodiment of the present disclosure, the voltage controlled resistor may include a field effect transistor.

Further, an embodiment of the present disclosure is a switching power supply device, including: the gate driving circuit; the main switching element; and a freewheeling diode connected in reverse parallel to the main switching element, wherein one of the main switching element and the freewheeling diode or both of the main switching element and the freewheeling diode are formed of a wide bandgap semiconductor.

Further, in the switching power supply device according to an embodiment of the present disclosure, the wide bandgap semiconductor may be formed of silicon carbide, a gallium nitride-based material, a gallium oxide-based material, or diamond.

According to the present disclosure, it is possible to provide the gate driving circuit and the switching power supply device capable of suppressing a surge voltage and a switching loss with a simple configuration.

BRIEF DESCRIPTION OF THE DRAWINGS

FIG. 12A is a diagram illustrating a voltage and a current at the time of reverse recovery of the freewheeling diode when the main switching element is turned on.

DETAILED DESCRIPTION OF THE INVENTION

A general gate driving circuit will be described prior to a description of a first embodiment of the gate driving circuit.

Figure 8:
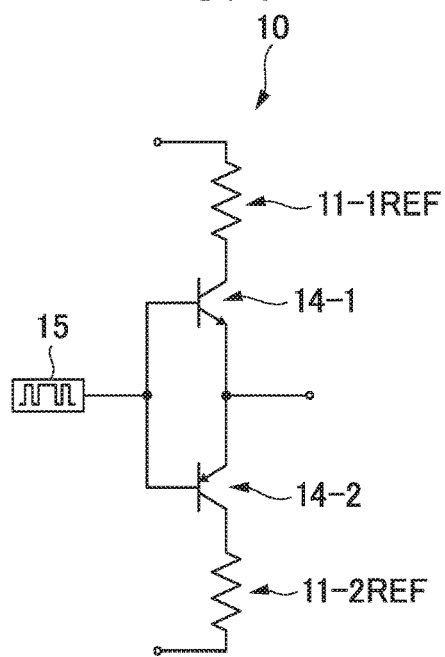
FIG. 8 is a circuit diagram illustrating main units of a general gate driving circuit.

FIG. 8 is a circuit diagram illustrating main units of a general gate driving circuit 10. The gate driving circuit 10 illustrated in FIG. 8 is provided with gate resistors 11-1REF and 11-2REF of which resistance values are set to fixed values, switching elements 14-1 and 14-2, and a signal source 15. In the example illustrated in FIG. 8, an end on one side (upper side in FIG. 8) of the gate resistor 11-1REF is connected to a high potential, and an end on the other side (lower side in FIG. 8) of the gate resistor 11-1REF is connected to a main switching element (not illustrated) via the switching element 14-1. Further, the main switching element is connected to an end on one side (upper side in FIG. 8) of the gate resistor 11-2REF via the switching element 14-2. An end on the other side (lower side in FIG. 8) of the gate resistor 11-2REF is connected to a low potential. The switching elements 14-1 and 14-2 are connected to the signal source 15.

In the example illustrated in FIG. 8, for example, the main switching element is turned on by a current flowing through the gate resistor 11-1REF and turned off by a current flowing through the gate resistor 11-2REF. That is, the main switching element is driven by the gate driving circuit 10. In the general gate driving circuit 10 as illustrated in FIG. 8, by appropriately setting the resistance values of the gate resistors 11-1REF and 11-2REF, a switching speed, a switching loss, and a surge voltage when the main switching element is turned on or off are adjusted.

Figure 9A:
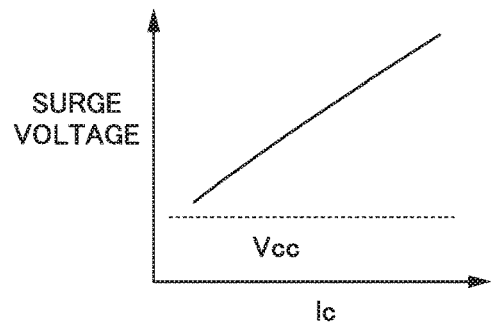
FIG. 9A is a diagram illustrating a relationship between a surge voltage at the time of switching of the main switching element (at the time of reverse recovery of the freewheeling diode and when the main switching element is turned off) and the output current value of the main switching element.
Figure 9B:
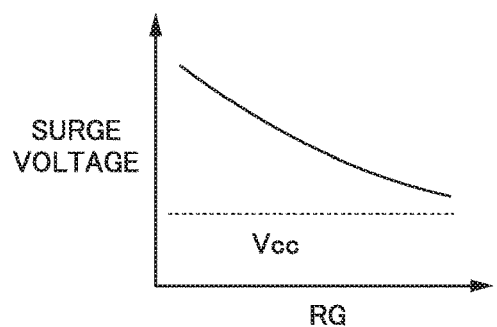
FIG. 9B is a diagram illustrating a relationship between the surge voltage at the time of switching of the main switching element (at the time of reverse recovery of the freewheeling diode and when the main switching element is turned off) and the resistance value of the gate resistors.

FIG. 9A is a diagram illustrating a relationship between a surge voltage at the time of switching of the main switching element (at the time of reverse recovery of the freewheeling diode and when the main switching element is turned off) and the output current value Ic of the main switching element. FIG. 9B is a diagram illustrating a relationship between the surge voltage at the time of switching of the main switching element (at the time of reverse recovery of the freewheeling diode and when the main switching element is turned off) and a resistance value RG of the gate resistors 11-1REF and 11-2REF. In FIGS. 9 A and 9B, Vcc indicates a potential difference set at both ends of the main switching element by a direct current power supply (not illustrated). A vertical axis of FIGS. 9A and 9B indicates the surge voltage at the time of switching of the main switching element. A horizontal axis in FIG. 9A indicates the output current value Ic of the main switching element, and a horizontal axis in FIG. 9B indicates the resistance value RG of the gate resistors 11-1REF and 11-2REF. As illustrated in FIG. 9A, when the output current value Ic of the main switching element increases, the surge voltage at the time of switching of the main switching element increases. On the other hand, as illustrated in FIG. 9B, when the resistance value RG of the gate resistors 11-1REF and 11-2REF increases, the surge voltage at the time of switching of the main switching element decreases.

Figure 10:
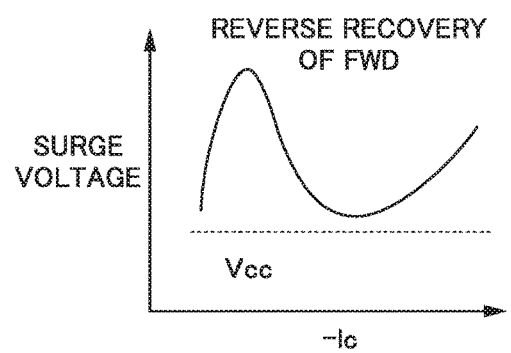
FIG. 10 is a diagram illustrating reverse recovery characteristics of a freewheeling diode (FWD) connected in reverse parallel to the main switching element that is driven by a gate driving circuit.

FIG. 10 is a diagram illustrating reverse recovery characteristics of a freewheeling diode (FWD) connected in reverse parallel to the main switching element that is driven by the gate driving circuit 10. A vertical axis in FIG. 10 indicates a surge voltage at the time of switching of the main switching element. A horizontal axis in FIG. 10 indicates a current of the freewheeling diode at the time of switching of the main switching element. In the example illustrated in FIG. 10, when the current of the freewheeling diode at the time of switching of the main switching element is low (that is, when the output current value of the main switching element is low), the surge voltage at the time of switching of the main switching element increases. In particular, when the current of the freewheeling diode at the time of switching of the main switching element is low and when the resistance value RG of the gate resistors 11-1REF and 11-2REF is small, the surge voltage at the time of switching of the main switching element (at the time of reverse recovery of the freewheeling diode) increases.

Figure 11A:
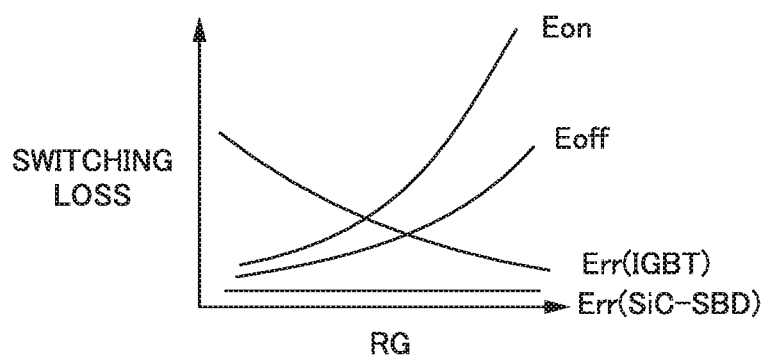
FIG. 11A is a diagram illustrating a relationship between a resistance value of the gate resistor and a switching loss.
Figure 11B:
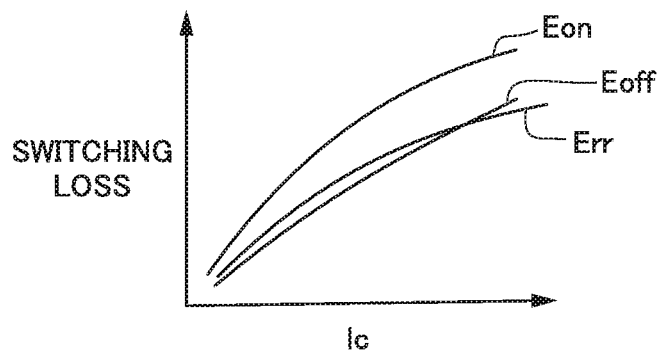
FIG. 11B is a diagram illustrating a relationship between an output current value and a switching loss of the main switching element.

FIG. 11A is a diagram illustrating a relationship between the resistance value RG of the gate resistors 11-1REF and 11-2REF and a switching loss that is a loss occurring at the time of switching of the main switching element. FIG. 11B is a diagram illustrating a relationship between the output current value Ic of the main switching element and the switching loss that is a loss occurring at the time of switching of the main switching element. A horizontal axis in FIG. 11A indicates the resistance value RG of the gate resistors 11-1REF and 11-2REF. A horizontal axis in FIG. 11B indicates the output current value Ic of the main switching element. A vertical axis in FIGS. 11A and 11B indicates the switching loss. Specifically, in FIGS. 11A and 11B, "Eon" indicates a loss occurring when the main switching element is turned on, "Eoff" indicates a loss occurring when the main switching element is turned off, and "Err" indicates a reverse recovery loss.

As illustrated in FIG. 11B, when the output current value Ic of the main switching element increases, the switching loss increases. As illustrated in FIG. 11A, when the resistance value RG of the gate resistors 11-1REF and 11-2REF increases, the losses Eon and Eoff that are generated in the main switching element at the time of switching of the main switching element increase. On the other hand, when the resistance value RG of the gate resistors 11-1REF and 11-2REF increases, the reverse recovery loss Err of the freewheeling diode decreases.

Figure 12A:
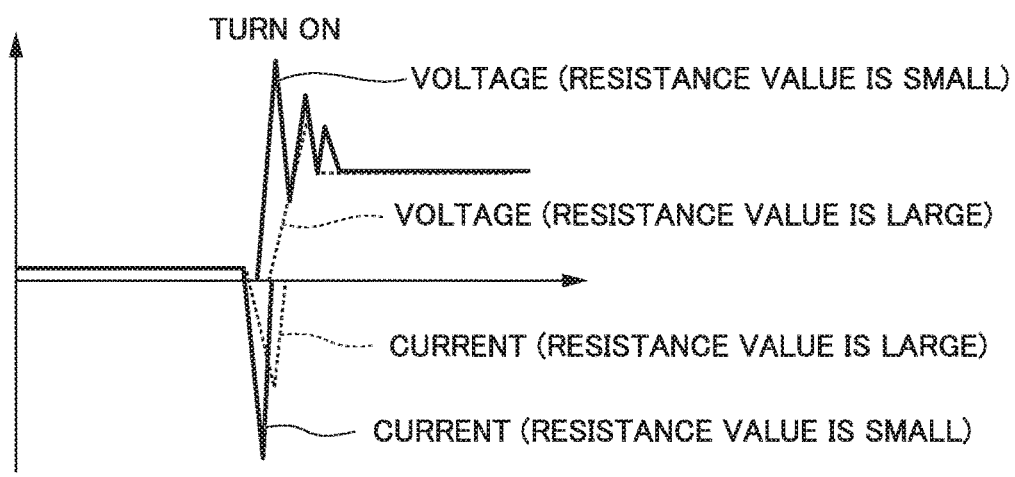
Figure 12B:
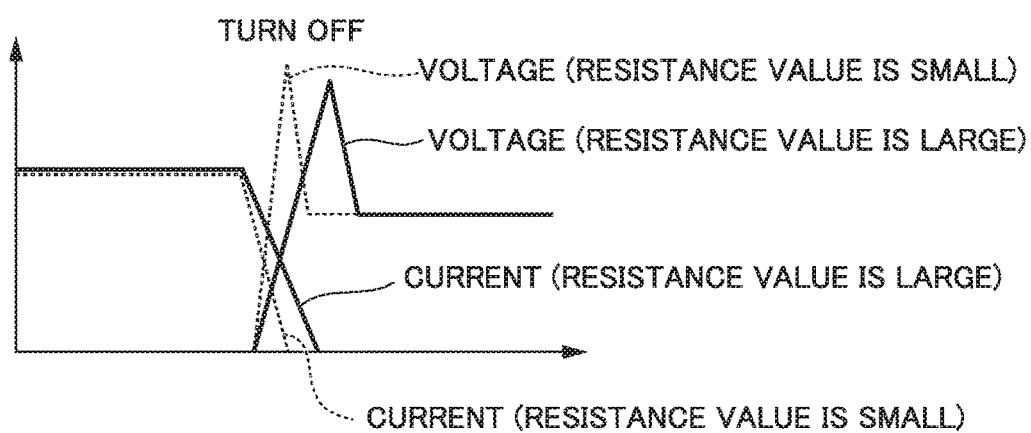
FIG. 12B is a diagram illustrating a voltage and a current when the main switching element is turned off.

FIG. 12A illustrates a voltage and a current at the time of reverse recovery of the freewheeling diode when the main switching element is turned on. FIG. 12B illustrates a voltage and a current when the main switching element is turned off.

In FIG. 12A, "voltage (resistance value is small)" indicates a surge voltage when the main switching element is turned on and when the resistance value RG of the gate resistors 11-1REF and 11-2REF is small, and "voltage (resistance value is large)" indicates when the main switching element is turned on and when the resistance value RG of the gate resistors 11-1REF and 11-2REF is large. As illustrated in FIG. 12A, the surge voltage when the main switching element is turned on and when the resistance value RG of the gate resistors 11-1REF and 11-2REF is small is greater than the surge voltage when the main switching element is turned on and when the resistance value RG of the gate resistors 11-1REF and 11-2REF is large.

In FIG. 12A, "current (resistance value is small)" indicates a reverse recovery current when the resistance value RG of the gate resistors 11-1REF and 11-2REF is small, and "current (resistance value is large)" indicates a reverse recovery current when the resistance value RG of the gate resistors 11-1REF and 11-2REF is large. As illustrated in FIG. 12A, the reverse recovery current when the resistance value RG of the gate resistors 11-1REF and 11-2REF is small is higher than the reverse recovery current when the resistance value RG of the gate resistors 11-1REF and 11-2REF is large.

In FIG. 12B, "voltage (resistance value is small)" indicates a surge voltage when the main switching element is turned off and when the resistance value RG of the gate resistors 11-1REF and 11-2REF is small, and "voltage (resistance value is large)" indicates a surge voltage when the main switching element is turned off and when the resistance value RG of the gate resistors 11-1REF and 11-2REF is large. As illustrated in FIG. 12B, the surge voltage when the main switching element is turned off and when the resistance value RG of the gate resistors 11-1REF and 11-2REF is small is greater than the surge voltage when the main switching element is turned off and when the resistance value RG of the gate resistors 11-1REF and 11-2REF is large.

In FIG. 12B, "current (resistance value is small)" indicates an output current value of the main switching element when the resistance value RG of the gate resistors 11-1REF and 11-2REF is small, and "current (resistance value is large)" indicates an output current value of the main switching element when the resistance value RG of the gate resistors 11-1REF and 11-2REF is large. As illustrated in FIG. 12B, a switching speed when the resistance value RG of the gate resistors 11-1REF and 11-2REF is small is higher than a switching speed when the resistance value RG of the gate resistors 11-1REF and 11-2REF is large.

As illustrated in FIGS. 9A and 9B, when the output current value Ic of the main switching element is high, it is preferable to increase the resistance value RG of the gate resistors 11-1REF and 11-2REF in order to suppress the surge voltage. As illustrated in FIG. 11A, it is possible to decrease the reverse recovery loss Err (IGBT) of the freewheeling diode by increasing the resistance value RG of the gate resistors 11-1REF and 11-2REF, but the losses Eon and Eoff that are generated in the main switching element at the time of switching of the main switching element increase.

As illustrated in FIG. 11A, it is necessary to decrease the resistance value RG of the gate resistors 11-1REF and 11-2REF in order to decrease the losses Eon and Eoff that are generated in the main switching element at the time of switching of the main switching element.

That is, in the example illustrated in FIG. 8 in which the resistance value of the gate resistors 11-1REF and 11-2REF is fixed, when the resistance value RG of the gate resistors 11-1REF and 11-2REF is set to a smaller value, the losses Eon and Eoff that are generated in the main switching element at the time of switching of the main switching element can be suppressed, but the reverse recovery loss Err at the time of switching of the main switching element increases, as illustrated in FIG. 11A. On the other hand, when the resistance value RG of the gate resistors 11-1REF and 11-2REF is set to a large value, the reverse recovery loss Err at the time of switching of the main switching element can be suppressed, but the losses Eon and Eoff that are generated in the main switching element at the time of switching of the main switching element increase.

Further, when the gate driving circuit is configured as described in Patent Document 1 in order to suppress the reverse recovery loss Err at the time of switching of the main switching element while suppressing the losses Eon and Eoff generated in the main switching element at the time of switching of the main switching element, the number of components increases and a configuration of the entire circuit becomes complicated.

Therefore, the gate driving circuit of the first embodiment is configured to be able to suppress the surge voltage and the switching loss with a simple configuration as described below.

<First Embodiment>

Figure 1:
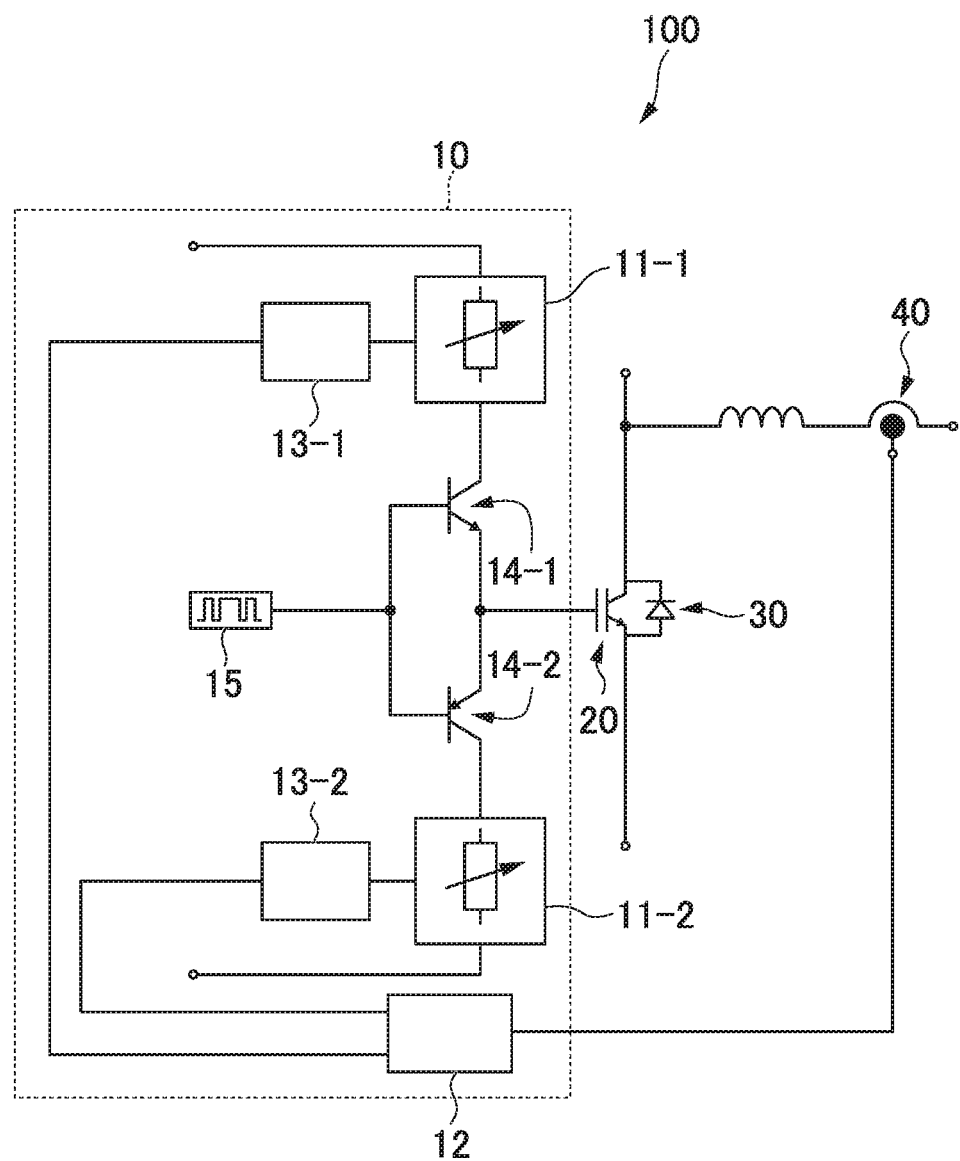
FIG. 1 is a circuit diagram illustrating a switching power supply device to which a gate driving circuit according to a first embodiment is applied.

FIG. 1 is a circuit diagram illustrating a switching power supply device 100 to which the gate driving circuit 10 of the first embodiment is applied. The gate driving circuit 10 illustrated in FIG. 1 includes gate resistors connected to a main switching element 20, and the gate resistors include voltage controlled resistors 11-1 and 11-2 of which the resistance value can be continuously changed. Further, the gate driving circuit 10 includes switching elements 14-1 and 14-2, and a signal source 15. Further, a freewheeling diode 30 is connected in reverse parallel to the main switching element 20.

In the example illustrated in FIG. 1, an end on one side (the upper side in FIG. 1) of the voltage controlled resistor 11-1 is connected to a high potential, and an end on the other side (the lower side in FIG. 1) of the voltage controlled resistor 11-1 is connected to the main switching element 20 via the switching element 14-1. Further, the main switching element 20 is connected to an end on one side (the upper side in FIG. 1) of the voltage controlled resistor 11-2 via the switching element 14-2. An end on the other side (the lower side in FIG. 1) of the voltage controlled resistor 11-2 is connected to a low potential. The switching elements 14-1 and 14-2 are connected to the signal source 15.

In the example illustrated in FIG. 1, the main switching element 20 is turned on by a current flowing through the voltage controlled resistor 11-1 and turned off by a current flowing through the voltage controlled resistor 11-2.

That is, the main switching element 20 is driven by the gate driving circuit 10.

In the example illustrated in FIG. 1, the gate driving circuit 10 includes a control circuit 12 and input units 13-1 and 13-2. An output current of the main switching element 20 detected by a current sensor 40 is input to the control circuit 12. The control circuit 12 converts the output current of the main switching element 20 into voltages for controlling the voltage controlled resistors 11-1 and 11-2. The voltage for controlling the voltage controlled resistor 11-1 is input from the control circuit 12 to the voltage controlled resistor 11-1 via the input unit 13-1. The voltage for controlling the voltage controlled resistor 11-2 is input from the control circuit 12 to the voltage controlled resistor 11-2 via the input unit 13-2.

Figure 2A:
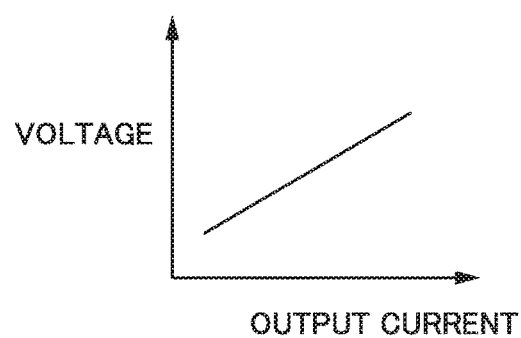
FIG. 2A is a diagram illustrating a relationship between an output current of a main switching element and a voltage for controlling a voltage controlled resistor.
Figure 2B:
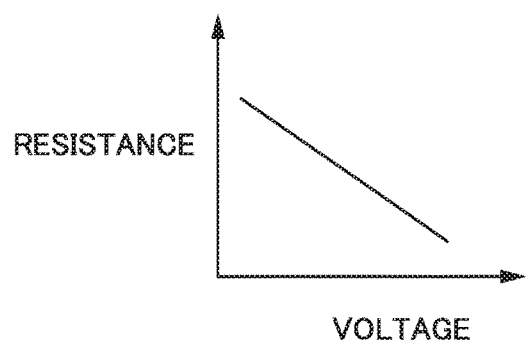
FIG. 2B is a diagram illustrating a relationship between the voltage for controlling the voltage controlled resistor and a resistance value of the voltage controlled resistor.

FIG. 2A is a diagram illustrating a relationship between the output current of the main switching element 20 and the voltage for controlling the voltage controlled resistors 11-1 and 11-2. FIG. 2B is a diagram illustrating a relationship between the voltage for controlling the voltage controlled resistors 11-1 and 11-2 and resistance values of the voltage controlled resistors 11-1 and 11-2. As illustrated in FIG. 2A, when the output current of the main switching element 20 increases, the voltage for controlling the voltage controlled resistors 11-1 and 11-2 increases. As illustrated in FIG. 2B, when the voltage for controlling the voltage controlled resistors 11-1 and 11-2 increases, the resistance values of the voltage controlled resistors 11-1 and 11-2 decrease.

That is, in the gate driving circuit 10 of the first embodiment, the control circuit 12 changes the voltage values input to the voltage controlled resistors 11-1 and 11-2 on the basis of the output current value of the main switching element 20.

Therefore, the resistance values of the voltage controlled resistors 11-1 and 11-2 can be changed according to the output current value of the main switching element 20.

Figure 3:
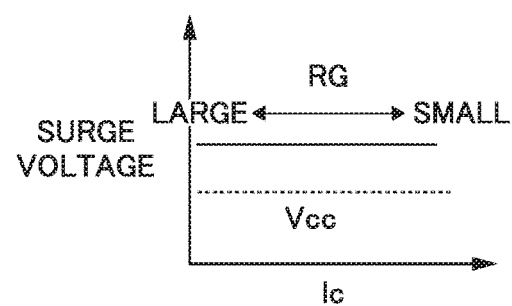
FIG. 3 is a diagram illustrating relationships between a surge voltage at the time of switching of the main switching element (at the time of reverse recovery of a freewheeling diode and when the main switching element is turned off), an output current value of the main switching element, and a resistance value of the voltage controlled resistor.

FIG. 3 is a diagram illustrating relationships between a surge voltage at the time of switching of the main switching element 20 (at the time of reverse recovery of the freewheeling diode and when the main switching element is turned off), the output current value Ic of the main switching element 20, and the resistance value RG of the voltage controlled resistors 11-1 and 11-2. In FIG. 3, Vcc indicates a potential difference set at both ends of the main switching element 20 by a direct current power supply (not illustrated). A vertical axis in FIG. 3 indicates the surge voltage at the time of switching of the main switching element 20. A horizontal axis in FIG. 3 indicates the output current value Ic of the main switching element.

In the example illustrated in FIG. 3, the resistance value RG of the voltage controlled resistor 11-1 is changed, such that it increases when the output current value Ic of the main switching element 20 decreases, so that the surge voltage at the time of reverse recovery of the freewheeling diode when the main switching element 20 is turned off does not change, even when the output current value Ic of the main switching element 20 changes. Further, the surge voltage when the main switching element 20 is turned off can be suppressed by increasing the resistance value of the voltage controlled resistor 11-2 when the output current value Ic of the main switching element 20 increases.

Figure 4:
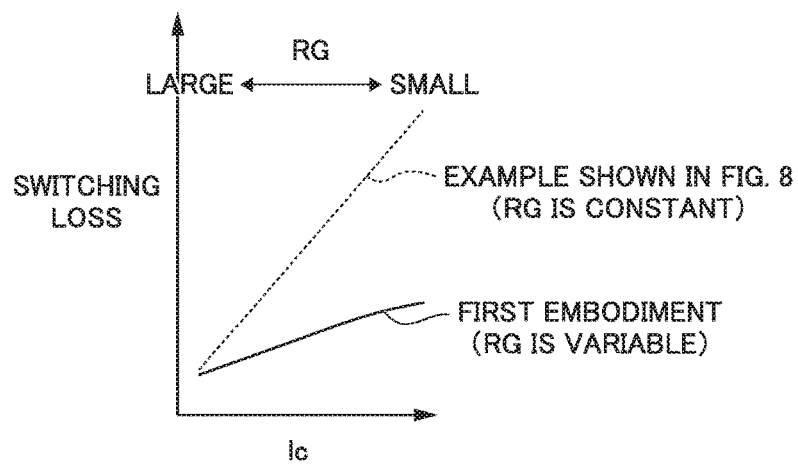
FIG. 4 is a diagram illustrating relationships between an output current value of the main switching element, a switching loss that is a loss occurring at the time of switching of the main switching element, and the resistance value of the voltage controlled resistor.

FIG. 4 is a diagram illustrating relationships between the output current value Ic of the main switching element 20, a switching loss that is a loss occurring at the time of switching of the main switching element 20, and the resistance value RG of the voltage controlled resistors 11-1 and 11-2. A horizontal axis in FIG. 4 indicates the output current value Ic of the main switching element 20, and a vertical axis in FIG. 4 indicates the switching loss. A solid line in FIG. 4 indicates a switching loss in the gate driving circuit 10 illustrated in FIG. 1, and a broken line in FIG. 4 indicates a switching loss in the gate driving circuit 10 illustrated in FIG. 8.

In the example indicated by the solid line in FIG. 4, the resistance value RG of the voltage controlled resistors 11-1 and 11-2 is changed so that the switching loss does not increase as in the example indicated by the broken line even when the output current value Ic of the main switching element changes. Therefore, the switching loss can be suppressed.

Specifically, in the example indicated by the solid line in FIG. 4, when the output current value Ic of the main switching element is small (for example, when the output current value Ic of the main switching element is equal to or smaller than 10% of a rated current), the switching loss is not high. Accordingly, the resistance value RG of the voltage controlled resistors 11-1 and 11-2 is changed to a large value in order to suppress the surge voltage. When the output current value Ic of the main switching element increases, the resistance value RG of the voltage controlled resistors 11-1 and 11-2 is changed to a small value, and an increase in switching loss is suppressed.

As described above, in the gate driving circuit 10 of the first embodiment, since the gate resistors include the voltage controlled resistors 11-1 and 11-2 of which the resistance value can be continuously changed, the surge voltage and the switching loss can be suppressed by a simple configuration.

Specifically, as illustrated in FIG. 11A, the losses Eon and Eoff that are generated in the main switching element 20 at the time of switching of the main switching element 20 can be suppressed by changing the resistance value of the voltage controlled resistors 11-1 and 11-2 to a small value. Further, the reverse recovery loss Err of the freewheeling diode 30 at the time of switching of the main switching element 20 can be suppressed by changing the resistance value of the voltage controlled resistors 11-1 and 11-2 to a large value. Further, it is possible to suppress the surge voltage by changing the resistance value of the voltage controlled resistors 11-1 and 11-2 to a large value, as illustrated in FIG. 9B.

In the example illustrated in FIG. 1, the voltage controlled resistors 11-1 and 11-2 include a field effect transistor (FET). Specifically, the voltage controlled resistors 11-1 and 11-2 are configured using the dependence of the on resistance of the field effect transistor on the gate voltage.

In the example illustrated in FIG. 1, the switching power supply device 100 includes the gate driving circuit 10, the main switching element 20, and the freewheeling diode 30 connected in reverse parallel to the main switching element 20. Further, part of the main switching element 20 and the freewheeling diode 30, or all of the main switching element 20 and the freewheeling diode 30 are formed of a wide bandgap semiconductor. Further, the wide bandgap semiconductor is formed of silicon carbide, a gallium nitride-based material, a gallium oxide-based material, or diamond.

Figure 5A:
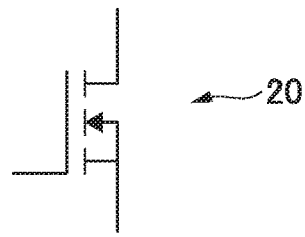
FIG. 5A is a diagram illustrating a first modification example of a main switching element to which the gate driving circuit of the first embodiment is applicable.
Figure 5B:
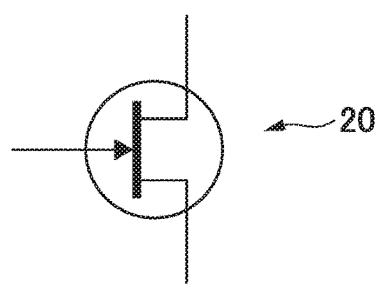
FIG. 5B is a diagram illustrating a second modification example of the main switching element to which the gate driving circuit of the first embodiment is applicable.

FIG. 5A is a diagram illustrating a first modification example of the main switching element 20 to which the gate driving circuit 10 of the first embodiment is applicable. FIG. 5B is a diagram illustrating a second modification example of the main switching element 20 to which the gate driving circuit 10 of the first embodiment is applicable. The gate driving circuit 10 of the first embodiment can be applied to, for example, an arbitrary main switching element, such as the main switching element 20 illustrated in FIG. 5A or the main switching element 20 illustrated in FIG. 5B, in place of the main switching element 20 illustrated in FIG. 1.

<Second Embodiment>

Figure 6:
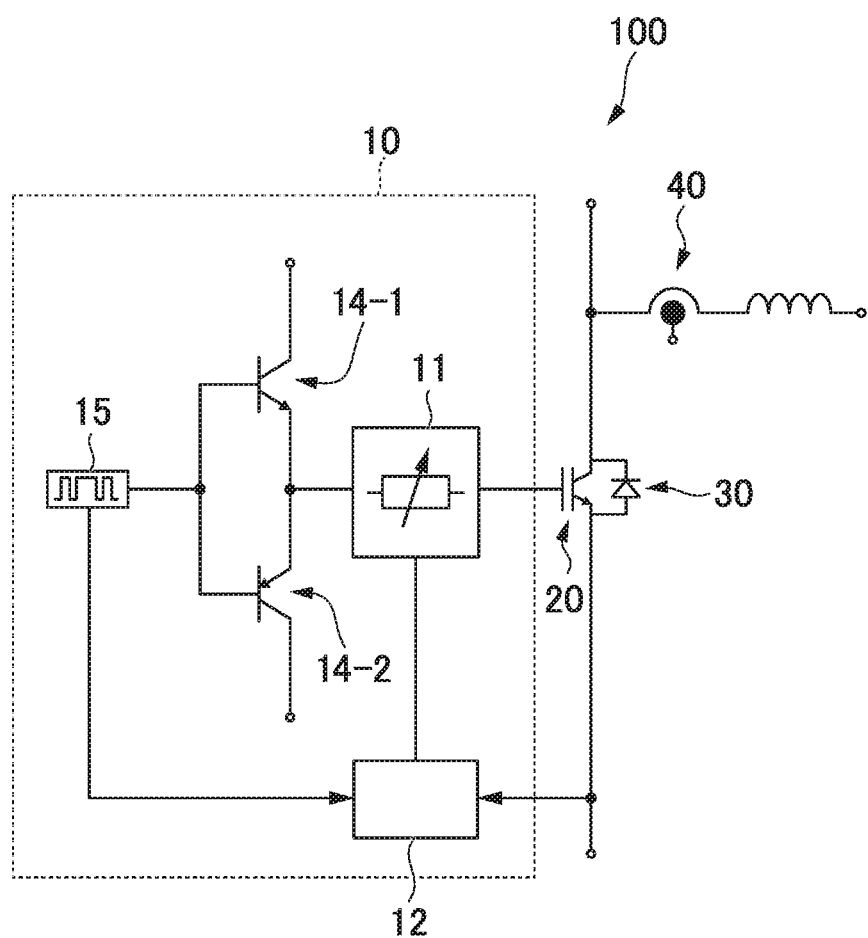
FIG. 6 is a circuit diagram illustrating a switching power supply device to which a gate driving circuit of a second embodiment is applied.

FIG. 6 is a circuit diagram illustrating a switching power supply device 100 to which a gate driving circuit 10 of a second embodiment is applied. The gate driving circuit 10 illustrated in FIG. 1 includes two voltage controlled resistors 11-1 and 11-2 of which the resistance value can be continuously changed, whereas the gate driving circuit 10 illustrated in FIG. 6 includes one voltage controlled resistor 11 of which the resistance value can be continuously changed. The voltage controlled resistor 11 functions as a gate resistor connected to the main switching element 20, similar to the voltage controlled resistors 11-1 and 11-2.

In the example illustrated in FIG. 6, an end on one side (left side in FIG. 6) of the voltage controlled resistor 11 is connected to switching elements 14-1 and 14-2, and an end on the other side (right side in FIG. 6) of the voltage controlled resistor 11 is connected to the main switching element 20. The switching elements 14-1 and 14-2 are connected to a signal source 15.

In the example illustrated in FIG. 6, the main switching element 20 is turned on by a current flowing through the switching element 14-1 and the voltage controlled resistor 11, and is turned off by a current flowing through the switching element 14-2 and the voltage controlled resistor 11. That is, the main switching element 20 is driven by the gate driving circuit 10.

In the example illustrated in FIG. 6, the gate driving circuit 10 includes a control circuit 12. An output current of the main switching element 20 is input to the control circuit 12. The control circuit 12 converts the output current of the main switching element 20 into a voltage for controlling the voltage controlled resistor 11. The voltage for controlling the voltage controlled resistor 11 is input from the control circuit 12 to the voltage controlled resistor 11.

That is, in the gate driving circuit 10 of the second embodiment, the control circuit 12 changes a voltage value to be input to the voltage controlled resistor 11 on the basis of the output current value of the main switching element 20. Therefore, it is possible to change the resistance value of the voltage controlled resistor 11 according to the output current value of the main switching element 20.

In the example illustrated in FIG. 6, a current sensor 40 may be omitted.

Further, in the example illustrated in FIG. 6, the control circuit 12 is also connected to the signal source 15.

That is, in the gate driving circuit 10 of the second embodiment, the control circuit 12 can change the voltage value to be input to the voltage controlled resistor 11 on the basis of a signal that is output from the signal source 15 that drives the main switching element 20. Therefore, it is possible to change the resistance value of the voltage controlled resistor 11 according to the signal output from the signal source 15 that drives the main switching element 20.

Figure 7A:
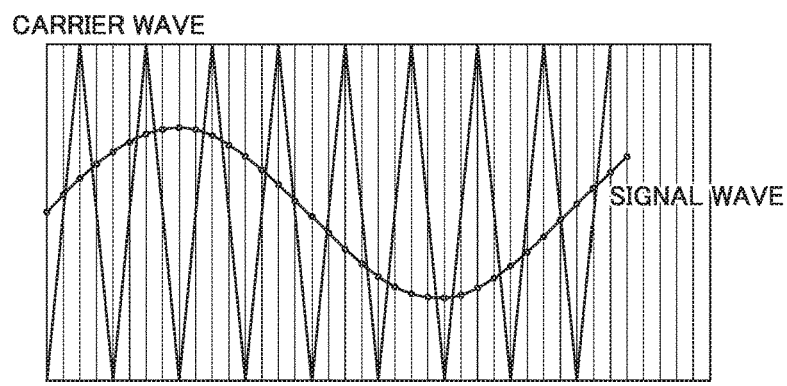
FIG. 7A illustrates a carrier wave and a signal wave that are used to generate a signal (a PWM output waveform) that is output from a signal source 15.
Figure 7B:
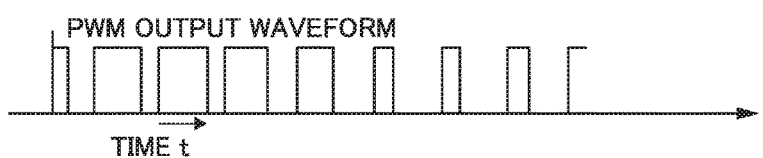
FIG. 7B illustrates the signal (the PWM output waveform) that is output from the signal source 15, and is generated from the carrier wave and the signal wave illustrated in FIG. 7A.
Figure 7C:
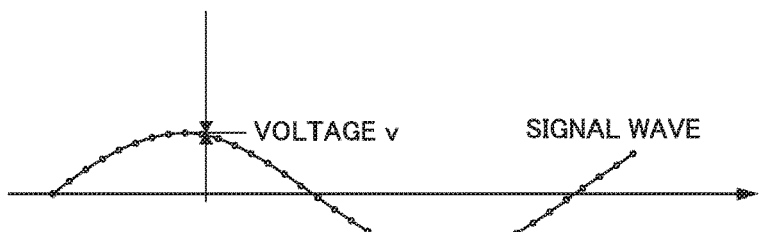
FIG. 7C illustrates a voltage (a signal wave) that is input to the voltage controlled resistor 11, and is generated by a control circuit 12.

FIGS. 7A, 7B, and 7C are diagrams illustrating an example in which the voltage value that is input to the voltage controlled resistor 11 is changed on the basis of the signal that is output from the signal source 15. FIG. 7A illustrates a carrier wave and a signal wave that are used to generate the signal (a PWM output waveform) that is output from the signal source 15. FIG. 7B illustrates the signal (the PWM output waveform) that is output from the signal source 15, and is generated from the carrier wave and the signal wave illustrated in FIG. 7A. FIG. 7C illustrates the voltage (a signal wave) that is generated by the control circuit 12 and input to the voltage controlled resistor 11.

In the example illustrated in FIGS. 7A, 7B, and 7C, the signal wave (see FIG. 7C) that is the same as the signal wave (see FIG. 7A) used to generate the signal (the PWM output waveform) (see FIG. 7B) output from the signal source 15 is generated by the control circuit 12 and input to the voltage controlled resistor 11.

Assuming that a current command or the like is sent to the gate driving circuit 10, there is a problem in which wirings are increased between the control circuit and the gate driving circuit 10. By controlling the voltage controlled resistor 11 on the basis of an on-off signal (for example, a PWM signal) sent from the signal source 15 to the main switching element 20, it is possible to control the voltage controlled resistor 11 without additional wirings.

When a PWM converter that is operated, substantially, with a power factor of 1 or a high power factor converter (PFC) is used, a fundamental wave phase of a PWM signal and a current phase substantially match, and a maximum current is obtained near 90° and 270°. Therefore, the resistance value of the voltage controlled resistor 11 can be changed on the basis of a fundamental wave phase angle of the PWM signal. Further, when a chopper circuit is used, the resistance value of the voltage controlled resistor 11 can be changed on the basis of a pulse width.

When, for example, a load with a known power factor such as a motor load is driven by the switching power supply device 100, the resistance value of the voltage controlled resistor 11 can be changed using a phase angle in consideration of the power factor.

When the gate driving circuit 10 is applied to the main switching element 20 into which a current sensor (not illustrated) is built, it is possible to effectively perform management of the surge voltage and the switching loss by sampling the output current value of the main switching element 20 at a timing of a rising edge and a falling edge of a PWM signal and setting a resistance value of the voltage controlled resistor 11 for the next turn-on and a resistance value of the voltage controlled resistor 11 for the next turn-off on the basis of the current value.

In the gate driving circuit 10 of the second embodiment, it is possible to achieve the same effects as those in the gate driving circuit 10 of the first embodiment. Further, in the gate driving circuit 10 of the second embodiment, it is possible to change the resistance value of the voltage controlled resistor 11 according to the signal that is output from the signal source 15 that drives the main switching element 20.

While the embodiments of the present disclosure and the modifications thereof have been described, the embodiments and the modifications thereof have been presented by way of example and are not intended to limit the scope of the disclosure. The embodiments and the modifications thereof can be embodied in a variety of other aspects, and various omissions, substitutions, and changes can be made without departing from the gist of the disclosure. The embodiments and the modifications thereof are included in the scope or the gist of the disclosure, and also included in the disclosure described in claims or the scope of their equivalents. Further, the embodiments and the modifications thereof described above can be appropriately combined with each other.

What is claimed is:

1. A gate driving circuit that is connected to a main switching element, the gate driving circuit comprising:
    a first switching element;
    a second switching element; and
    a gate resistor,
    wherein the gate resistor includes a first voltage controlled resistor of which a resistance value is able to be continuously changed, and a second voltage controlled resistor of which a resistance value is able to be continuously changed,
    an end on one side of the first voltage controlled resistor is connected to a high potential, and an end on the other side of the first voltage controlled resistor is connected to the main switching element via the first switching element,
    the main switching element is connected to an end on one side of the second voltage controlled resistor via the second switching element,
    an end on the other side of the second voltage controlled resistor is connected to a low potential.

2. The gate driving circuit according to claim 1, further comprising a control circuit configured to set a voltage value that is input to the first voltage controlled resistor and the second voltage controlled resistor on the basis of an output current value of the main switching element.

3. The gate driving circuit according to claim 1, further comprising a control circuit configured to set a voltage value that is input to the voltage controlled resistor on the basis of a signal that is output from a signal source that drives the main switching element.

4. The gate driving circuit according to claim 1, wherein the first voltage controlled resistor and the second voltage controller resistor include a field effect transistor.

5. A switching power supply device comprising the gate driving circuit according to claim 1, and further comprising:
    a freewheeling diode connected in reverse parallel to the main switching element,
    wherein at least one of:

(1) a part of the main switching element and the freewheeling diode, and (2) all of the main switching element and the freewheeling diode,
are formed of a wide bandgap semiconductor.

6. The switching power supply device according to claim 5,
wherein the wide bandgap semiconductor is formed of silicon carbide, a gallium nitride-based material, a gallium oxide-based material, or diamond.

* * * * *